(12) United States Patent
Kim et al.

(10) Patent No.: US 10,133,114 B2
(45) Date of Patent: Nov. 20, 2018

(54) DISPLAY DEVICE HAVING A LIGHT BLOCKING PATTERN

(71) Applicant: SAMSUNG DISPLAY CO., LTD., Yongin-si, Gyeonggi-do (KR)

(72) Inventors: Yoonjang Kim, Seoul (KR); Wansoon Im, Cheonan-si (KR); Sungryul Kim, Asan-si (KR); Yunseok Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/396,781

(22) Filed: Jan. 2, 2017

(65) Prior Publication Data

US 2017/0285393 A1   Oct. 5, 2017

(30) Foreign Application Priority Data

Apr. 4, 2016  (KR) .................... 10-2016-0041020

(51) Int. Cl.
  *G02F 1/1335*  (2006.01)
  *G02F 1/1343*  (2006.01)
  (Continued)

(52) U.S. Cl.
  CPC ...... *G02F 1/133512* (2013.01); *G02F 1/1368* (2013.01); *G02F 1/13439* (2013.01); *G02F 1/134309* (2013.01); *G02F 1/136286* (2013.01); *H01L 27/124* (2013.01); *H01L 27/1225* (2013.01); *H01L 29/24* (2013.01); *H01L 29/7869* (2013.01); *H01L 29/78633* (2013.01); *G02F 1/1337* (2013.01);
  (Continued)

(58) Field of Classification Search
  None
  See application file for complete search history.

(56) References Cited

U.S. PATENT DOCUMENTS 5,724,107 A * 3/1998 Nishikawa ........ G02F 1/136213
                                                    349/110
5,879,959 A * 3/1999 Chen ................. G02F 1/136209
                                                     257/59

(Continued)

FOREIGN PATENT DOCUMENTS

KR    1020090072352 A    7/2009
KR    1020130030649 A    3/2013

(Continued)

*Primary Examiner* — Erik Kielin
(74) *Attorney, Agent, or Firm* — Cantor Colburn LLP

(57) ABSTRACT

A display device includes: a base substrate including a pixel area at which an image is displayed; a light blocking pattern on the base substrate; a thin film transistor on the light blocking pattern; a gate line connected to the thin film transistor and lengthwise extending in a first direction; a data line connected to the thin film transistor and lengthwise extending in a second direction; and a pixel electrode in the pixel area and spaced apart from the gate line in the second direction. The light blocking pattern includes: a first light blocking pattern lengthwise extending in the first direction; and a second light blocking pattern overlapping the thin film transistor. The first light blocking pattern overlaps the gate line and the pixel electrode spaced apart from each other in the second direction.

15 Claims, 9 Drawing Sheets

(51) Int. Cl.
  *G02F 1/1362* (2006.01)
  *G02F 1/1368* (2006.01)
  *H01L 27/12* (2006.01)
  *H01L 29/786* (2006.01)
  *H01L 29/24* (2006.01)
  *G02F 1/1333* (2006.01)
  *G02F 1/1337* (2006.01)

(52) U.S. Cl.
  CPC .. *G02F 1/133345* (2013.01); *G02F 2201/121* (2013.01); *G02F 2201/123* (2013.01); *G02F 2201/40* (2013.01)

(56) References Cited

U.S. PATENT DOCUMENTS

| | | | |
|---|---|---|---|
| 6,346,717 B1* | 2/2002 | Kawata | G02F 1/136209 257/350 |
| 8,350,975 B2 | 1/2013 | Lee et al. | |
| 9,389,470 B1* | 7/2016 | Tien | G02F 1/136209 |
| 2006/0082709 A1* | 4/2006 | Hung | G02F 1/136213 349/129 |
| 2008/0062100 A1* | 3/2008 | Hong | G09G 3/3696 345/87 |
| 2010/0231834 A1* | 9/2010 | Wang | H01L 29/78633 349/110 |
| 2013/0106919 A1* | 5/2013 | Wang | G02F 1/136209 345/690 |
| 2014/0042429 A1* | 2/2014 | Park | H01L 29/66742 257/43 |
| 2015/0171154 A1 | 6/2015 | Kang | |

FOREIGN PATENT DOCUMENTS

| | | |
|---|---|---|
| KR | 1020150051351 A | 5/2015 |
| KR | 1020150070855 A | 6/2015 |

\* cited by examiner

DISPLAY DEVICE HAVING A LIGHT BLOCKING PATTERN

This application claims priority to Korean Patent Application No. 10-2016-0041020, filed on Apr. 4, 2016, and all the benefits accruing therefrom under 35 U.S.C. § 119, the content of which in their entirety is herein incorporated by reference.

BACKGROUND

1. Field

Exemplary embodiments of the invention relate to a liquid crystal display ("LCD") device, and more particularly, to an LCD device capable of effectively reducing light leakage occurring between a pixel electrode and a signal line and in which an aperture ratio is improved.

2. Description of the Related Art

Display devices are classified into a liquid crystal display ("LCD") device, an organic light emitting diode ("OLED") display device, a plasma display panel ("PDP") device, an electrophoretic display ("EPD") device, and the like, based on a light emitting scheme thereof.

An LCD device includes a display substrate including electrodes formed therein, an opposing substrate, and a liquid crystal layer between the display substrate and the opposing substrate. Further, in order to define a plurality of pixel areas, the LCD device employs a structure in which a light blocking member is disposed on one of the display substrate and the opposing substrate or a structure in which a shielding electrode is disposed among pixel electrodes.

SUMMARY

Exemplary embodiments of the invention are directed to a display device and particularly liquid crystal display ("LCD") device capable of effectively reducing light leakage between a pixel electrode and a signal line and in which an aperture ratio is improved.

According to an exemplary embodiment of the invention, a display device includes: a base substrate including a pixel area at which an image is displayed; a light blocking pattern on the base substrate; a thin film transistor on the light blocking pattern; a gate line connected to the thin film transistor and defining a length thereof extending in a first direction; a data line connected to the thin film transistor and defining a length thereof extending in a second direction crossing the first direction; and a pixel electrode in the pixel area and spaced apart from the gate line in the second direction. The light blocking pattern includes: a first light blocking pattern defining a length thereof extending in the first direction; and a second light blocking pattern overlapping the thin film transistor. The first light blocking pattern overlaps the gate line and the pixel electrode spaced apart from each other in the second direction.

In an exemplary embodiment, the first light blocking pattern may be disposed between the pixel electrode and the gate line spaced apart from each other, in a top plan view.

In an exemplary embodiment, the second light blocking pattern may not overlap the data line.

In an exemplary embodiment, the liquid crystal display device may further include a black matrix disposed on the thin film transistor and the data line and defining a length thereof extending in the second direction.

In an exemplary embodiment, the pixel electrode may define a length dimension thereof in the first direction larger than a dimension thereof in the second direction.

In an exemplary embodiment, the thin film transistor may include: a semiconductor layer on the base substrate; a gate electrode branching off from the gate line and disposed on the semiconductor layer; a source electrode branching off from the data line and connected to the semiconductor layer; and a drain electrode spaced apart from the source electrode and connected to the semiconductor layer.

In an exemplary embodiment, the semiconductor layer may be respectively between the light blocking pattern, and the source electrode and the drain electrode.

In an exemplary embodiment, the source electrode and the drain electrode are each disposed between the light blocking pattern and the semiconductor layer.

In an exemplary embodiment, the semiconductor layer may include at least one selected from zinc oxide ("ZnO"), zinc tin oxide ("ZTO"), zinc indium oxide ("ZIO"), indium oxide ("InO"), titanium oxide ("TiO"), indium-gallium-zinc oxide ("IGZO") and indium-zinc-tin oxide ("IZTO").

In an exemplary embodiment, the first light blocking pattern and the second light blocking pattern may be connected to each other at an intersecting area therebetween.

In an exemplary embodiment, the first light blocking pattern and the second light blocking pattern may be separated from each other at a virtual intersecting area therebetween.

In an exemplary embodiment, the pixel electrode may include a cross-shaped stem portion and a branch portion which extends from the cross-shaped stem portion.

In an exemplary embodiment, the light blocking pattern may further include a third light blocking pattern disposed on the base substrate and overlapping the cross-shaped stem portion of the pixel electrode.

In an exemplary embodiment, the first to third light blocking patterns may be disposed in the same layer as each other.

According to another exemplary embodiment of the invention, a display device includes: a base substrate including a pixel area at which an image is displayed; a light blocking pattern on the base substrate; a thin film transistor on the light blocking pattern; a gate line connected to the thin film transistor and defining a length thereof extending in a first direction; a data line connected to the thin film transistor and defining a length thereof extending in a second direction crossing the first direction; and a pixel electrode in the pixel area and spaced apart from the data line in the first direction. The light blocking pattern includes a first light blocking pattern overlapping the thin film transistor; and a second light blocking pattern defining a length thereof extending in the second direction. The second light blocking pattern overlaps the data line and the pixel electrode spaced apart from each other in the first direction.

In an exemplary embodiment, the second light blocking pattern may be disposed between the pixel electrode and the data line spaced apart from each other, in a top plan view.

In an exemplary embodiment, the first light blocking pattern may not overlap the gate line defining the length thereof extending in the first direction.

In an exemplary embodiment, the liquid crystal display device may further include a black matrix disposed on the thin film transistor and the gate line and defining a length thereof extending in the first direction.

In an exemplary embodiment, the pixel electrode may define a length dimension thereof in the first direction which is larger than a dimension thereof in the second direction.

In an exemplary embodiment, the thin film transistor includes: a semiconductor layer on the base substrate; a gate electrode branching off from the gate line and disposed on the semiconductor layer; a source electrode branching off from the data line and connected to the semiconductor layer; and a drain electrode spaced apart from the source electrode and connected to the semiconductor layer.

The foregoing is illustrative only and is not intended to be in any way limiting. In addition to the illustrative embodiments and features described above, further embodiments and features will become apparent by reference to the drawings and the following detailed description.

BRIEF DESCRIPTION OF THE DRAWINGS

The above and other features of the present disclosure of invention will be more clearly understood from the following detailed description taken in conjunction with the accompanying drawings, in which.

DETAILED DESCRIPTION

Figure 1:
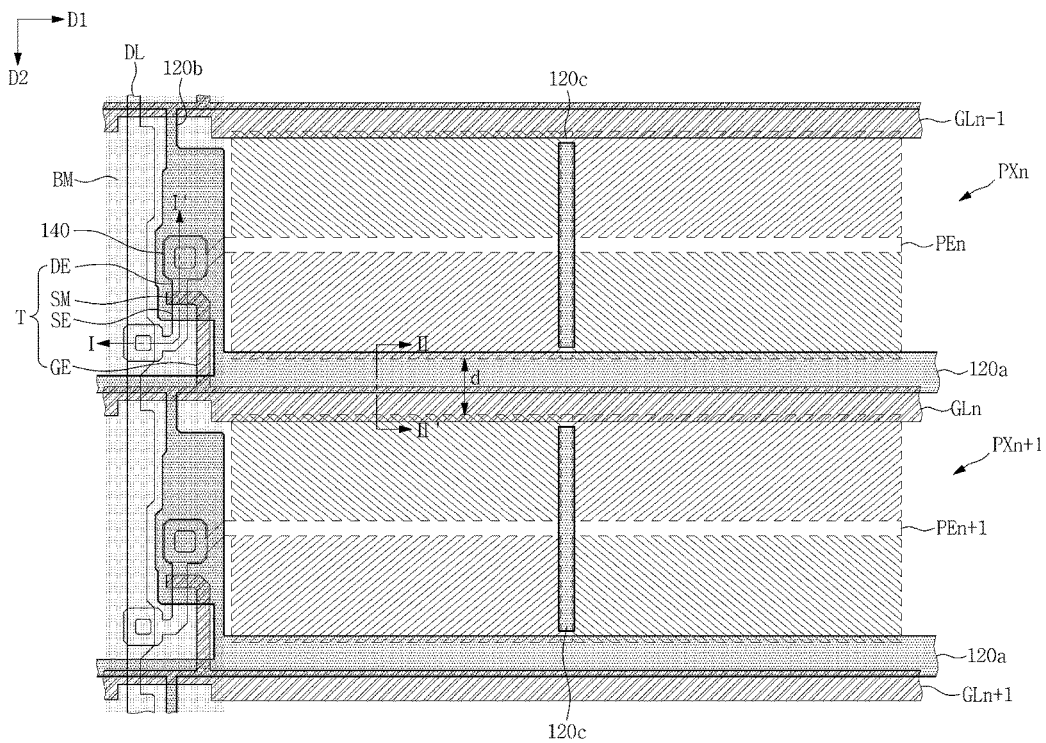
FIG. 1 is a schematic top plan view illustrating an exemplary embodiment of a display device as a liquid crystal display ("LCD") device.

Exemplary embodiments will now be described more fully hereinafter with reference to the accompanying drawings. Although the invention can be modified in various manners and have several embodiments, exemplary embodiments are illustrated in the accompanying drawings and will be mainly described in the specification. However, the scope of the invention is not limited to the exemplary embodiments and should be construed as including all the changes, equivalents, and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "less," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the invention, and like reference numerals refer to like elements throughout the specification.

In the case where the light blocking member is disposed on the opposing substrate to define a plurality of pixel areas at which an image is displayed, transmittance of the LCD device may decrease due to misalignment that occurs in a process of coupling the opposing substrate and the display substrate. In addition, in the case where the light blocking member is disposed on the display substrate to define a plurality of pixel areas at which an image is displayed, a layer of the display substrate at an edge portion thereof is relatively thin, and thus light leakage may occur.

In addition, in the case where the shielding electrode is disposed among the pixel electrodes to define a plurality of pixel areas at which an image is displayed, the shielding electrode and the pixel electrode are spaced apart from each other at a predetermined distance, and thus transmittance of the LCD device may decrease.

Therefore, an improved display device is desired capable of reducing light leakage occurring between a pixel electrode and a signal line thereof and in which an aperture ratio is improved.

Figure 2:
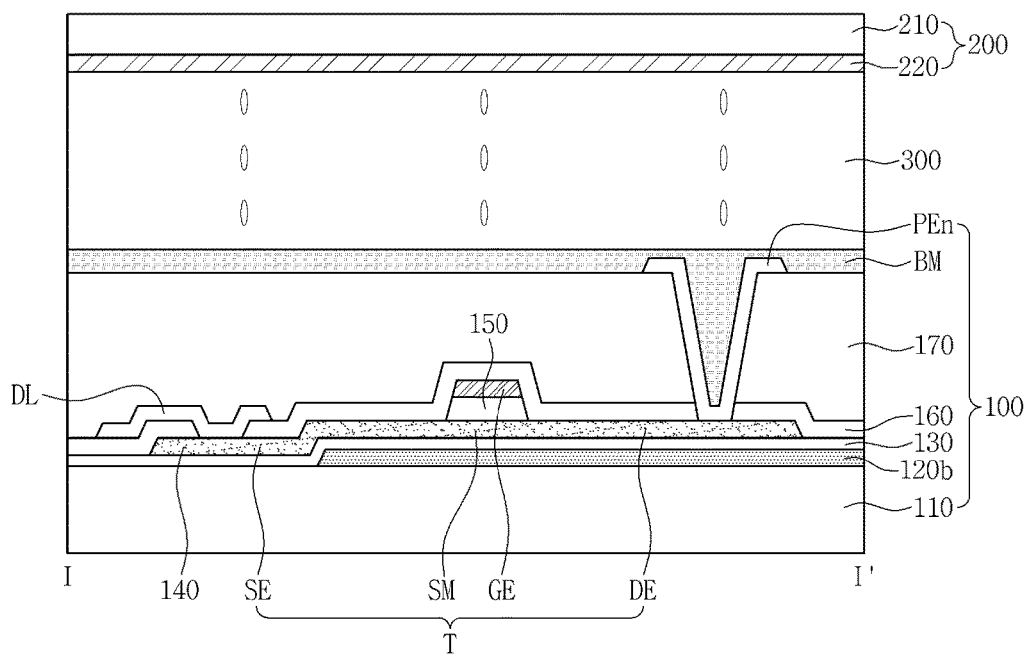
FIG. 2 is a cross-sectional view taken along line I-I' of FIG. 1.
Figure 3:
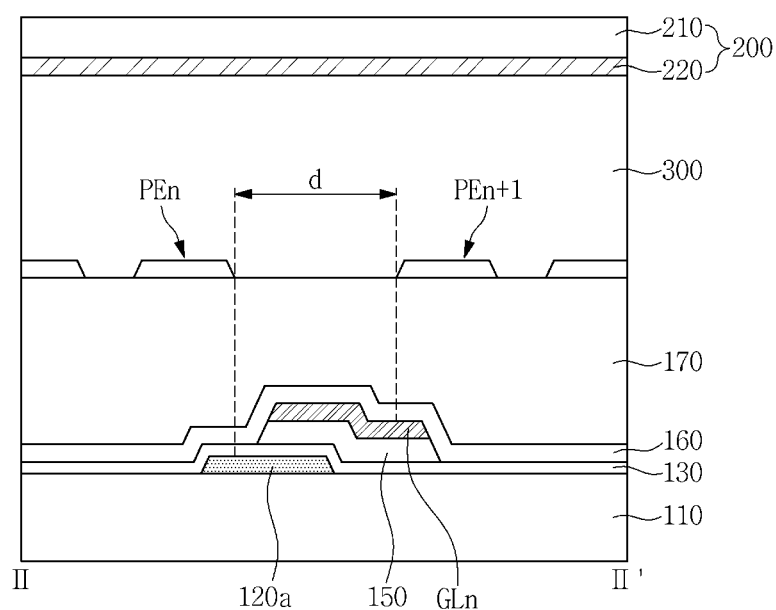
FIG. 3 is a cross-sectional view taken along line II-II' of FIG. 1.

FIG. 1 is a schematic top plan view illustrating an exemplary embodiment of a display device as liquid crystal display ("LCD") device, FIG. 2 is a cross-sectional view taken along line I-I' of FIG. 1, and FIG. 3 is a cross-sectional view taken along line II-II' of FIG. 1. An exemplary embodiment of an LCD device includes a pixel provided in plurality. FIG. 1 illustrates two pixels $PX_n$ and $PX_{n+1}$ that define a length thereof which is larger than a width thereof taken perpendicular to the length. Referring to FIG. 1, a width of each of the two pixels $PX_n$ and $PX_{n+1}$ extend in a second direction D2 and the two pixels $PX_n$ and $PX_{n+1}$ are arranged in parallel to and adjacent to each other in a second direction D2, for ease of description. Within the $PX_n$ and $PX_{n+1}$, a pixel area is defined at which an image is displayed. A remaining area of the $PX_n$ and $PX_{n+1}$ except for the pixel area may define an area at which the image is not displayed.

Referring to FIGS. 1, 2 and 3, an exemplary embodiment of an LCD device includes a display substrate 100, an opposing substrate 200, and an optical medium layer such as a liquid crystal layer 300 between the display substrate 100 and the opposing substrate 200. The display substrate 100, the opposing substrate 200 and the optical medium layer 300 may collectively form a display panel of the LCD device which generates and displays an image. The pixels $PX_n$ and $PX_{n+1}$ within the display panel may generate and display an image of the LCD device. In addition, an exemplary embodiment of an LCD device may further include a backlight unit (not illustrated) as a light source of the LCD device which that generates and provides light to the display panel such as to the display substrate 100. Exemplary embodiments of the invention are not limited to the LCD device, and may be applicable to any of a number of display devices such as an organic light emitting diode ("OLED") device, for example.

The display substrate 100 includes a base substrate 110, light blocking patterns 120a, 120b and 120c, a first insulating layer 130, a semiconductor layer pattern 140, a second insulating layer 150, a gate wiring including a gate line provided in plural such as gate lines $GL_{n-1}$, $GL_n$, $GL_{n+1}$ and a gate electrode GE, a third insulating layer 160, a data line DL, a fourth insulating layer 170, pixel electrodes $PE_n$ and $PE_{n+}$, a black matrix BM, and the like. The gate line and the data line may otherwise be referred to as a signal line. Among the aforementioned elements and referring to FIGS. 1 to 3, a pixel may include the base substrate 110, the light blocking patterns 120a, 120b and 120c, the first insulating layer 130, the semiconductor layer pattern 140, the second insulating layer 150, a gate line and a gate electrode connected thereto, the third insulating layer 160, the data line DL, the fourth insulating layer 170, a pixel electrode and the black matrix BM, but the invention is not limited thereto. The pixel electrode may be disposed in the pixel area portion of the pixel.

The base substrate 110 may be an insulating substrate, e.g., a plastic substrate, which has light transmitting characteristics and flexibility. However, exemplary embodiments are not limited thereto, and the base substrate 110 may include a relatively hard and rigid substrate such as a glass substrate.

The light blocking patterns 120a, 120b and 120c are disposed on the base substrate 110. One or more of the light blocking patterns 120a, 120b and 120c may be disposed in plurality on the base substrate 110.

The light blocking patterns 120a, 120b and 120c may include a material that may absorb and block light. In an exemplary embodiment, for example, the light blocking patterns 120a, 120b and 120c may include or be formed of aluminum (Al) or alloys thereof, silver (Ag) or alloys thereof, copper (Cu) or alloys thereof, molybdenum (Mo) or alloys thereof, chromium (Cr), tantalum (Ta), and titanium (Ti), but exemplary embodiments are not limited thereto. In an alternative exemplary embodiment, the light blocking patterns 120a, 120b and 120c may include any suitable metals or conductors by which light is absorbed or blocked.

A light blocking pattern defines a length thereof which is larger than a width thereof taken perpendicular to the length. An exemplary embodiment of light blocking patterns 120a, 120b and 120c includes a first light blocking pattern 120a lengthwise extending in a first direction D1, a second light blocking pattern 120b lengthwise extending in the second direction D2 which intersects the first direction D1, and a third light blocking pattern 120c which lengthwise extends in the second direction D2 and is spaced apart from the second light blocking pattern 120b in the first and second directions D1 and D2. In an exemplary embodiment of a method of manufacturing a display device, the first, second and third light blocking patterns 120a, 120b and 120c may be simultaneously provided in a same process such as from a same material layer. The first, second and third light blocking patterns 120a, 120b and 120c are disposed in a same layer of the display substrate 100 among layers thereof disposed on the base substrate 110.

The first light blocking pattern 120a is disposed lengthwise along the first direction D1 to overlap each of a gate line provided in plurality such as gate lines $GL_{n-1}$, $GL_n$ and $GL_{n+1}$ and each of a pixel electrode provided in plurality such as the pixel electrodes $PE_n$ and $PE_{n+1}$ Thus, the first light blocking pattern 120a is capable of reducing or effectively preventing light leakage that may occur among the gate lines $GL_{n-1}$, $GL_n$ and $GL_{n+1}$ and the pixel electrodes $PE_n$ and $PE_{n+1}$.

The second light blocking pattern 120b is disposed to overlap at least a portion of a thin film transistor T, and is thus capable of reducing or effectively preventing light incident from the backlight unit to the thin film transistor T.

The third light blocking pattern 120c is disposed to overlap a stem portion of each of the pixel electrodes $PE_n$ and $PE_{n+1}$, and is thus capable of reducing or effectively preventing light leakage that may occur at the stem portion of the pixel electrodes $PE_n$ and $PE_{n+1}$.

The light blocking patterns 120a, 120b and 120c may externally receive a ground voltage or a storage voltage such as from a voltage source external to the display substrate 100 and/or the display panel. In an alternative exemplary embodiment, the light blocking patterns 120a, 120b and 120c may not externally receive a voltage, and may be electrically floated as not being electrically connected to another element of the display panel or the LCD device.

Figure 4:
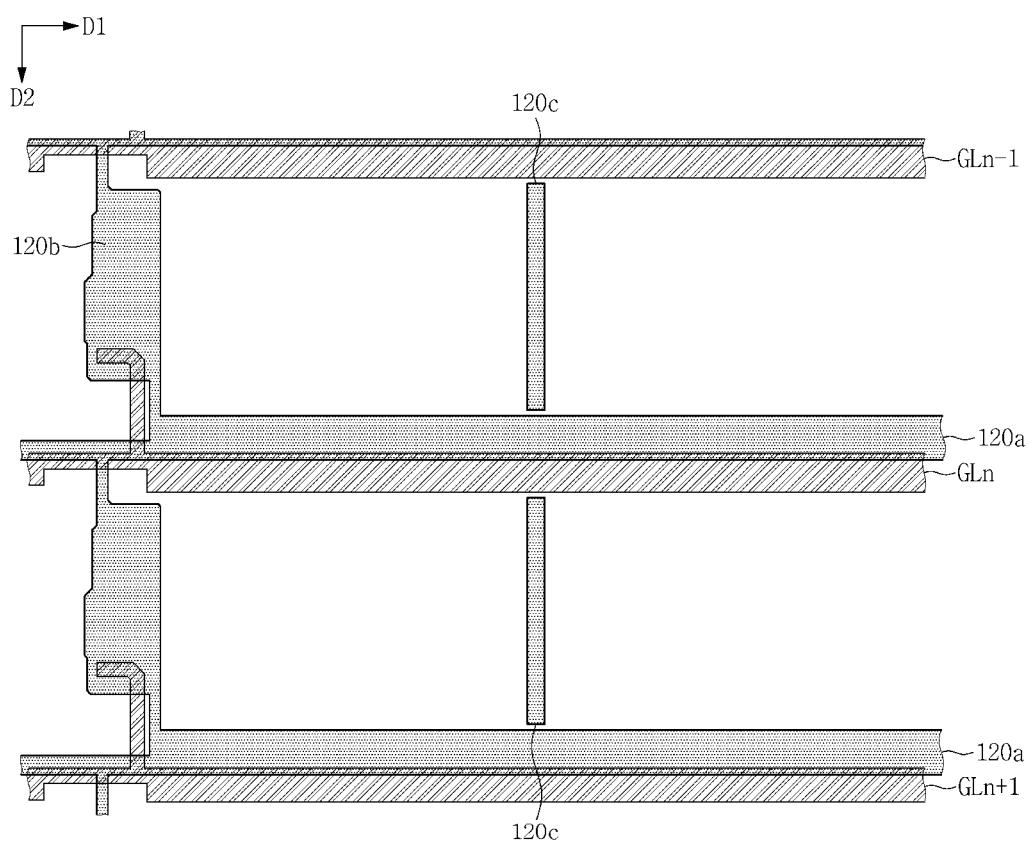
FIG. 4 is a top plan view illustrating an exemplary embodiment of a light blocking pattern.
Figure 5:
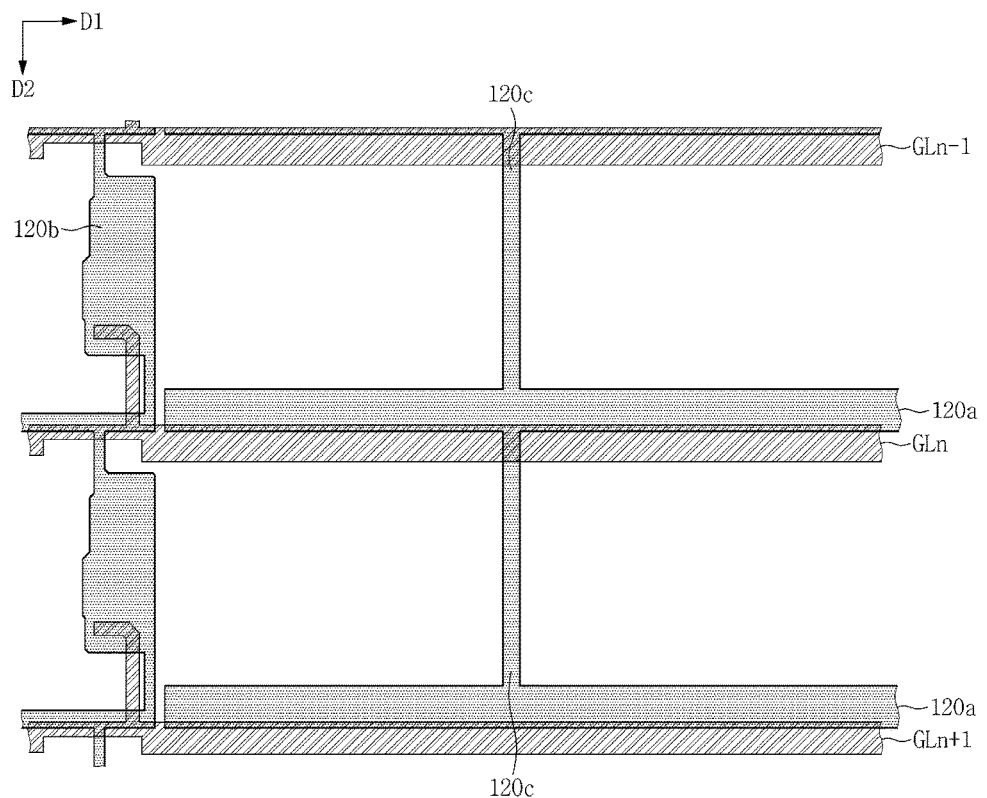
FIGS. 5, 6, and 7 are plan views illustrating alternative exemplary embodiments of a light blocking pattern.
Figure 6:
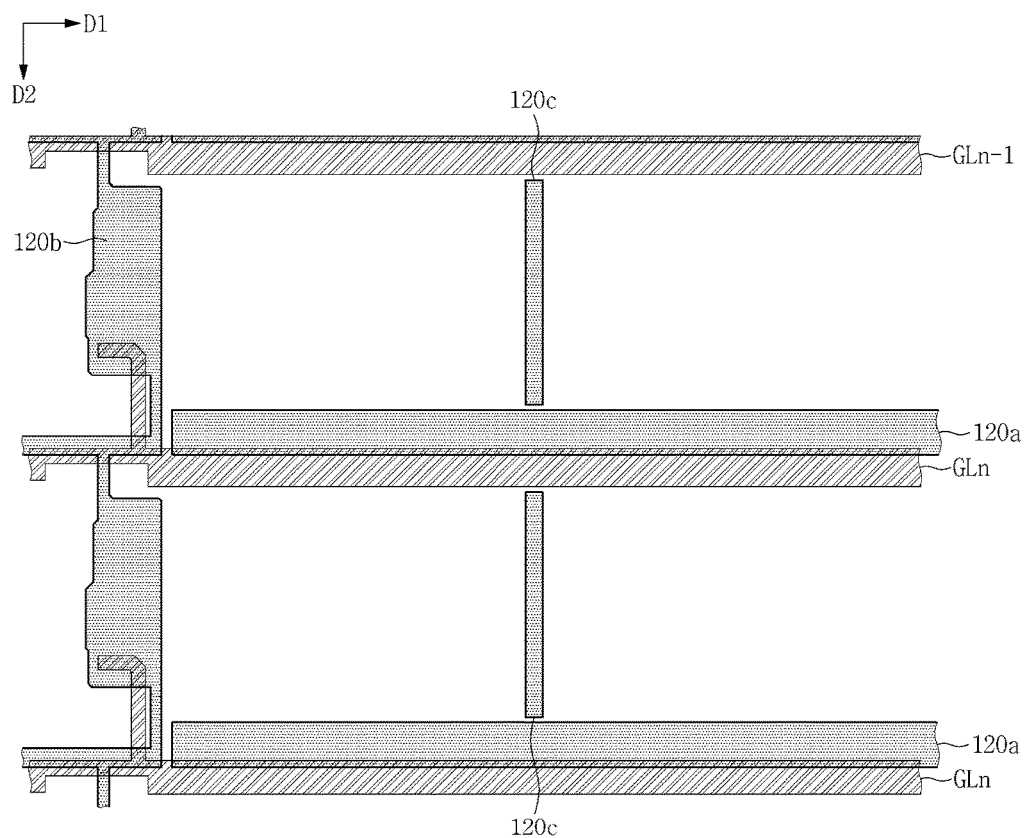
Figure 7:
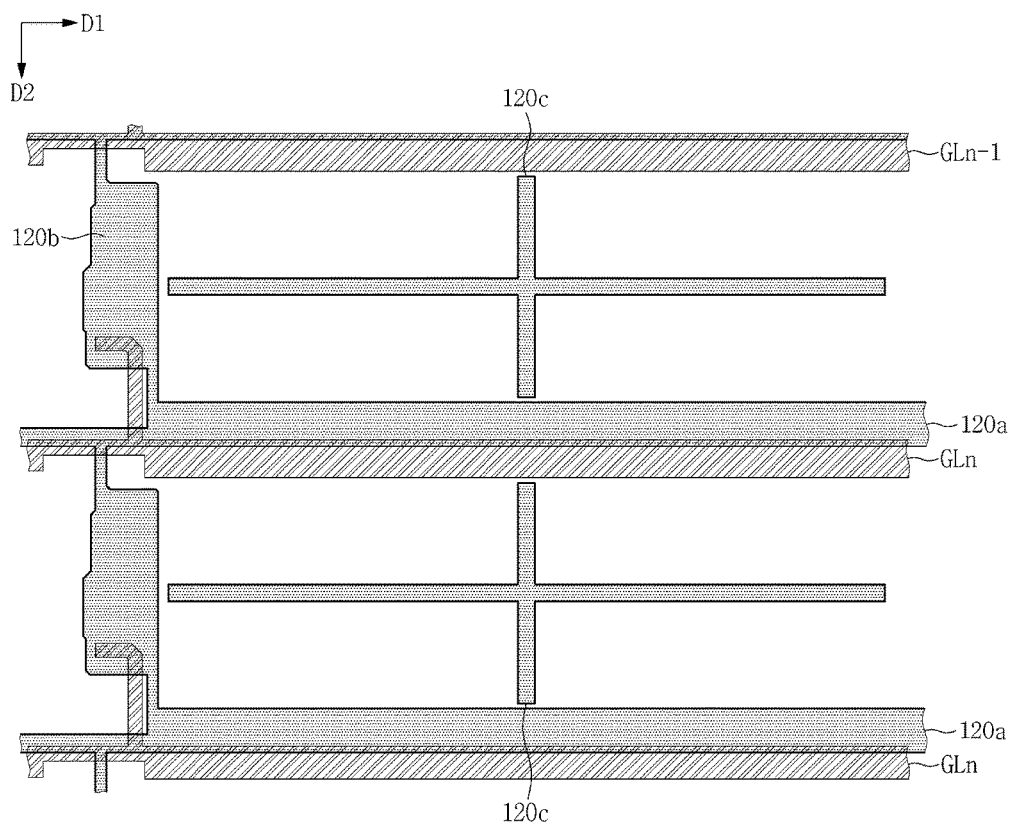

FIG. 4 is a top plan view illustrating an exemplary embodiment of a light blocking pattern, and FIGS. 5, 6 and 7 are top plan views illustrating alternative exemplary embodiments of a light blocking pattern.

Referring to FIG. 4, an exemplary embodiment of light blocking patterns 120a, 120b and 120c may include a first light blocking pattern 120a lengthwise extending in a first direction D1, a second light blocking pattern 120b lengthwise extending in a second direction D2 which intersects the first direction D1, and a third light blocking pattern 120c which lengthwise extends in the second direction D2 and is spaced apart from the second light blocking pattern 120b in the first and second directions D1 and D2.

The first light blocking pattern 120a and the second light blocking pattern 120b may be connected to each other at an intersecting area therebetween, and the first light blocking pattern 120a and the third light blocking pattern 120c may be separated from each other at a virtual intersecting area therebetween. The first light blocking pattern 120a and the second light blocking pattern 120b may form a single, unitary light blocking member. One of the first light blocking pattern 120a and the second light blocking pattern 120b may be considered as extending to define the other one of the first light blocking pattern 120a and the second light blocking pattern 120b.

Between pixels adjacent to each other in the second direction D2, adjacent second light blocking patterns 120b are connected to each other to form a single, unitary blocking member. One second light blocking pattern 120b may be considered as extending to define an adjacent second light blocking pattern 120b. The second light blocking pattern 120b does not overlap the data line DL.

However, exemplary embodiments are not limited thereto, and the first light blocking pattern 120a and the second light blocking pattern 120b may be separated from each other at the virtual intersecting area therebetween, and the first light blocking pattern 120a and the third light blocking pattern 120c may be connected to each other at the intersecting area therebetween (refer to FIG. 5).

In addition, the first light blocking pattern 120a, the second light blocking pattern 120b and the third light blocking pattern 120c may be separated from one another (refer to FIG. 6) at virtual intersection areas therebetween.

In addition, the third light blocking pattern 120c may be disposed to have a cross shape to overlap a cross-shaped stem portion of a pixel electrode to be described hereinbelow (refer to FIG. 7).

Referring back to FIGS. 1, 2 and 3, the first insulating layer 130 is disposed on the base substrate 110 on which the light blocking patterns 120a, 120b and 120c are disposed. The first insulating layer 130 may include silicon oxide (SiOx) or silicon nitride (SiNx). In addition, the first insulating layer 130 may further include aluminum oxide, titanium oxide, tantalum oxide or zirconium oxide.

The semiconductor layer pattern 140 is disposed on the first insulating layer 130. At least a portion of the semiconductor layer pattern 140 overlaps the second light blocking pattern 120b. The semiconductor layer pattern 140 may include an oxide semiconductor material.

The oxide semiconductor material is a metal oxide semiconductor, and may include a metal oxide based on zinc (Zn), gallium (Ga), tin (Sn), titanium (Ti), or indium (In), or a composition including zinc (Zn), gallium (Ga), tin (Sn), titanium (Ti), or indium (In) and an oxide thereof. In an exemplary embodiment, for example, the oxide semiconductor material may include at least one selected from zinc oxide ("ZnO"), zinc tin oxide ("ZTO"), zinc indium oxide ("ZIO"), indium oxide ("InO"), titanium oxide ("TiO"), indium-gallium-zinc oxide ("IGZO") and indium-zinc-tin oxide ("IZTO").

The semiconductor layer pattern 140 is divided into or defines a source electrode SE, a semiconductor layer SM and a drain electrode DE such as through an impurity injection process. In an exemplary embodiment of the impurity injection process, a portion of a semiconductor material layer overlapped by the gate electrode GE and the second insulating layer 150 is not injected with impurities. Since the portion of the semiconductor material layer overlapped by the gate electrode GE and the second insulating layer 150 is not injected with impurities, such portion functions as the semiconductor layer SM. Another portion such as remaining portion thereof which is injected with impurities is metalized to function as the source electrode SE or the drain electrode DE. In an exemplary embodiment of manufacturing an LCD device, the impurities may be injected to the semiconductor layer pattern 140 through a plasma scheme. The impurities may use hydrogen ($H_2$).

The second insulating layer 150 is disposed on the base substrate 110 on which the semiconductor layer pattern 140 is disposed. The second insulating layer 150 may include silicon oxide (SiOx) or silicon nitride (SiNx), and may be referred to as a gate insulating layer.

The gate lines define a length thereof which is larger than a width thereof taken perpendicular to the length. Referring to FIG. 1, a width of each of gate line extends in the second direction D2. The gate wiring which includes the gate lines $GL_{n-1}$, $GL_n$ and $GL_{n+1}$ lengthwise extending in the first direction D1 and a gate electrode GE respectively branching off from the gate lines $GL_{n-1}$, $GL_n$, and $GL_{n+1}$ and overlapping the semiconductor layer SM is disposed on the second insulating layer 150.

The gate wiring may include or be formed of aluminum (Al) or alloys thereof, silver (Ag) or alloys thereof, copper (Cu) or alloys thereof, molybdenum (Mo) or alloys thereof, chromium (Cr), tantalum (Ta), titanium (Ti) and/or the like.

In addition, the gate wiring may have a multilayer structure including two or more conductive layers (not illustrated) in a cross-sectional or thickness direction having different physical properties from each other. In an exemplary embodiment, for example, a conductive layer of the multilayer structure may include or be formed of metal having relatively low resistivity to reduce signal delay or voltage drop, e.g., an aluminum (Al)-based metal, a silver (Ag)-based metal and a copper (Cu)-based metal, and another conductive layer of the multilayer structure may include a material that is found to impart excellent contact properties with indium tin oxide ("ITO") and indium zinc oxide ("IZO"), e.g., a molybdenum-based metal, chromium, titanium, tantalum and the like.

Examples of the multilayer structure may include a chromium lower layer and an aluminum upper layer, an aluminum lower layer and a molybdenum upper layer, and a titanium lower layer and a copper upper layer. However, exemplary embodiments are not limited thereto, and the gate wiring may include various kinds of metals and conductors. In an exemplary embodiment of a method of manufacturing a display device, the gate wiring may be simultaneously formed in a same process such as from a same material layer. Portions of the gate wiring are disposed in a same layer of the display substrate 100 among layers thereof disposed on the base substrate 110.

The third insulating layer 160 is disposed on the base substrate 110 on which the gate wiring is disposed. The third insulating layer 160 may also be referred to as an insulating interlayer. The third insulating layer 160 may include silicon oxide (SiOx) or silicon nitride (SiNx).

The data line DL defines a length thereof which is larger than a width thereof taken perpendicular to the length. Referring to FIG. 1, a width of each data line DL extends in the first direction D1. The data line DL which lengthwise extends in the second direction D2 intersecting the first direction D1 is disposed on the third insulating layer 160. The data line DL on the third insulating layer 160 extends to pass through the third insulating layer 160 to be connected to the source electrode SE. Referring to FIG. 2, an opening is defined in or by the third insulating layer 160, and the data line DL on the third insulating layer 160 extends into the opening to contact the source electrode SE at the opening. The data line DL may include a same material as that included in the aforementioned gate wiring.

The fourth insulating layer 170 is disposed on the base substrate 110 on which the data line DL is disposed. The fourth insulating layer 170 may have a monolayer structure or a multilayer structure in the cross-sectional or thickness direction including, for example, silicon oxide, silicon nitride, a photosensitive organic material, or a low dielectric constant insulating material such as a-Si:C:O or a-Si:O:F.

In addition, the fourth insulating layer 170 may be a color filter. The color filter may be one selected from a red color filter, a green color filter, a blue color filter, a cyan color filter, a magenta color filter, a yellow color filter and a white color filter. Three primary colors of red, green and blue, or cyan, magenta and yellow may define a basic pixel group for forming a color.

The pixel electrodes $PE_n$ and $PE_{n+1}$ are disposed on the fourth insulating layer 170. The pixel electrodes $PE_n$ and $PE_{n+1}$ on the fourth insulating layer 170 extend to pass through the third insulating layer 160 and the fourth insulating layer 170 to be connected to the drain electrode DE. Referring again to FIG. 2, an opening is defined in or by the third and fourth insulating layers 160 and 170, and pixel electrodes $PE_n$ and $PE_{n+1}$ on the fourth insulating layer 170 extend into the opening to contact the drain electrode DE at the opening.

The pixel electrodes $PE_n$ and $PE_{n+1}$ may include or be formed of a transparent conductive material. In an exemplary embodiment, for example, the pixel electrodes $PE_n$ and $PE_{n+1}$ may include a transparent conductive material such as indium tin oxide ("ITO"), indium zinc oxide ("IZO"), indium tin zinc oxide ("ITZO") or aluminum zinc oxide ("AZO").

The pixel electrodes $PE_n$ and $PE_{n+1}$ define lengths thereof which are larger than widths thereof taken perpendicular to the lengths. In FIG. 1, the pixel electrodes $PE_n$ and $PE_{n+1}$ are depicted as having a longer dimension (e.g., length) in the first direction D1 than that in the second direction D2, but exemplary embodiments are not limited thereto. In an alternative exemplary embodiment, the pixel electrodes $PE_n$ and $PE_{n+1}$ may have a shorter dimension (e.g., width) in the first direction D1 than that in the second direction D2.

In addition, the pixel electrodes $PE_n$ and $PE_{n+1}$ are depicted as including a cross-shaped stem portion and a plurality of branch portions which extend from the cross-shaped stem portion, but exemplary embodiments are not limited thereto. Any of a number of pixel electrode shapes may be applicable to an exemplary embodiment of the invention without limitation.

The black matrix BM defines a length thereof which is larger than a width thereof taken perpendicular to the length. The black matrix BM is disposed on the base substrate 110 on which the pixel electrodes $PE_n$ and $PE_{n+1}$ are disposed. The black matrix BM may lengthwise extend in the second direction D2 to overlap the thin film transistor T, the data line DL and the second light blocking pattern 120b.

The black matrix BM reduced or effectively prevents light provided from the backlight unit (not illustrated) from being dissipated externally, and reduces or effectively prevents external light from being irradiated to the thin film transistor T and the data line DL.

The black matrix BM may include or be formed of a photosensitive composition. Examples of the photosensitive composition may include: a binder resin, a polymerizable monomer, a polymerizable oligomer, a pigment, a dispersant and a photoinitiator. The pigment may use a black pigment, a black resin or the like.

A lower alignment layer (not illustrated) may be disposed on the pixel electrodes $PE_n$ and $PE_{n+1}$ and the black matrix BM. The lower alignment layer may be a homeotropic alignment layer or a photoalignment layer including a photopolymerizable material.

Referring to FIG. 3, the first light blocking pattern 120a overlaps at least a portion of the pixel electrode $PE_n$ and the gate line $GL_n$ in the top plan view. The pixel electrode $PE_n$ and the gate line $GL_n$ may be separated from each other in the second direction D2 in the top plan view. That is, the first light blocking pattern 120a is disposed between the pixel electrode $PE_n$ and the gate line $GL_n$ in the top plan view. In addition, the gate line $GL_n$ may be disposed to overlap another pixel electrode $PE_{n+1}$ that is adjacent to and separated from the pixel electrode $PE_n$ in the top plan view. That is, the first light blocking pattern 120a and the gate line $GL_n$ collectively form a light blocking member between the pixel electrodes $PE_n$ and $PE_{n+1}$ which are adjacent to and separated from each other.

Accordingly, light leakage that may occur in an area among adjacent and separated pixel electrodes $PE_n$ and $PE_{n+1}$ may be reduced or effectively prevented using the first light blocking pattern 120a and the gate line $GL_n$. The first light blocking pattern 120a and the gate line $GL_n$ disposed in the area may overlap an entirety of the area 'd'. The area is defined between edges of the pixel electrodes $PE_n$ and $PE_{n+1}$ adjacent to each other. Where one of the first light blocking pattern 120a and the gate line $GL_n$ disposed in the area may occupy a portion of the area at edges of the pixel electrodes $PE_n$ and $PE_{n+1}$ adjacent to each other, the other of the first light blocking pattern 120a and the gate line $GL_n$ occupies a remaining portion of the area 'd'.

In an exemplary embodiment of an LCD device, a light blocking member or a shielding electrode that are conventionally disposed among conventional pixel electrodes adjacent to and separated from each other may be omitted such that an aperture ratio may be improved.

The opposing substrate 200 may include an opposing base substrate 210, a common electrode 220, and the like.

The opposing base substrate 210 may be an insulating substrate, e.g., a plastic substrate, having light transmitting characteristics and flexibility. However, exemplary embodiments are not limited thereto, and the opposing base substrate 210 may include a relatively hard and rigid substrate such as a glass substrate.

The common electrode 220 may be a plate electrode including a transparent conductor such as indium tin oxide ("ITO") or indium zinc oxide ("IZO"). In an alternative exemplary embodiment, except for a plate portion thereof, the common electrode 220 may have an uneven portion and/or at least one slit to define a plurality of domains in a pixel.

An upper alignment layer (not illustrated) may be disposed on the common electrode 220. The upper alignment layer (not illustrated) may be a homeotropic alignment layer or a photoalignment layer including a photopolymerizable material.

Figure 8:
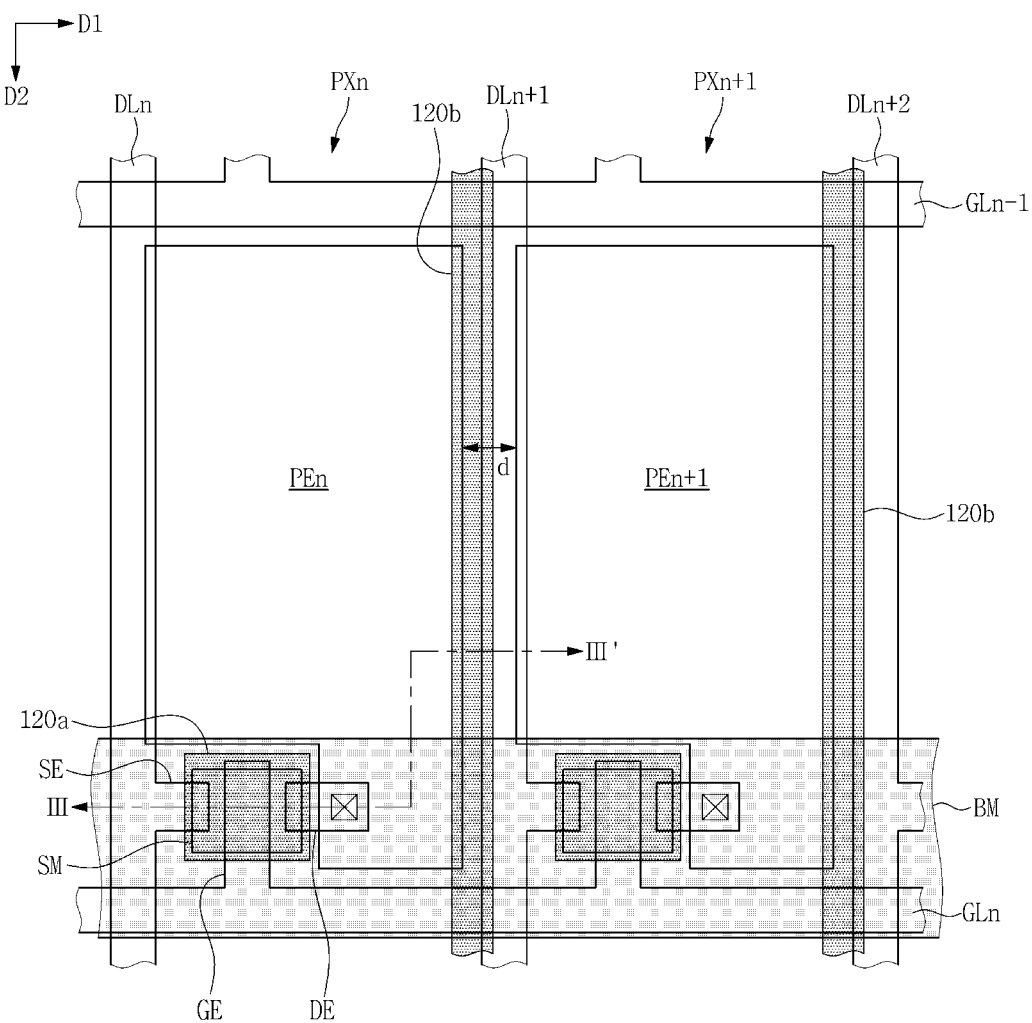
FIG. 8 is a schematic top plan view illustrating an alternative exemplary embodiment of a display device as a liquid crystal display ("LCD") device.
Figure 9:
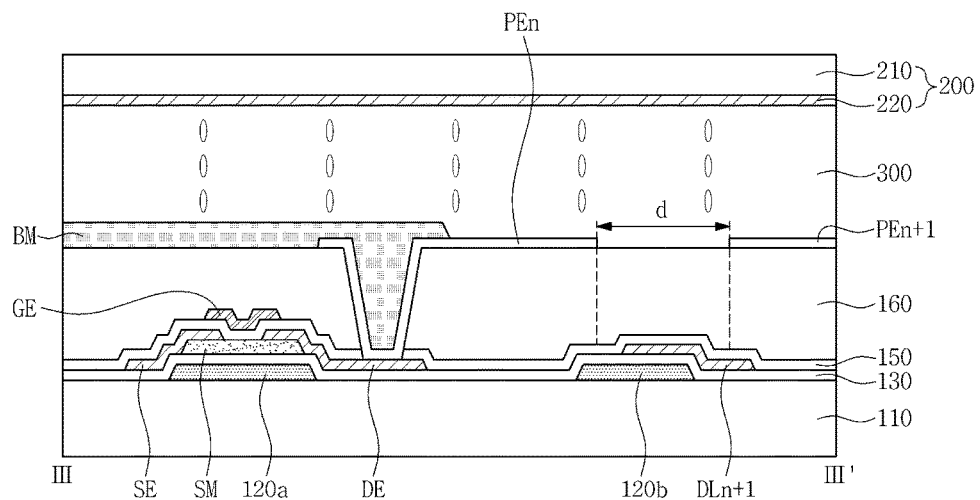
FIG. 9 is a cross-sectional view taken along line III-III' of FIG. 8.

FIG. 8 is a schematic top plan view illustrating an alternative exemplary embodiment of a display device as an LCD device, and FIG. 9 is a cross-sectional view taken along line III-III' of FIG. 8. FIG. 8 illustrates two pixels $PX_n$ and $PX_{n+1}$ that are arranged adjacent to and in parallel to each other in a first direction D1, for ease of description. Repeated descriptions of an exemplary embodiment will be omitted in descriptions pertaining to an alternative exemplary embodiment.

Referring to FIGS. 8 and 9, an alternative exemplary embodiment of an LCD device includes a display substrate 100, an opposing substrate 200, and an optical medium layer such as a liquid crystal layer 300 between the display substrate 100 and the opposing substrate 200. The display substrate 100, the opposing substrate 200 and the optical medium layer 300 may collectively form a display panel of the LCD device which generates and displays an image.

The display substrate 100 includes a base substrate 110, light blocking patterns 120a and 120b, a first insulating layer 130, a semiconductor layer SM, a data wiring including data lines $DL_n$, $DL_{n+1}$, $DL_{n+2}$, a source electrode SE and a drain electrode DE, a second insulating layer 150, a gate wiring including gate lines $GL_{n-1}$, $GL_n$, and a gate electrode GE, a third insulating layer 160, pixel electrodes $PE_n$ and $PE_{n+1}$, a black matrix BM and the like.

The light blocking patterns 120a and 120b are disposed on the base substrate 110.

The light blocking patterns 120a and 120b may include a material that may absorb and block light. A light blocking pattern defines a length thereof which is larger than a width thereof taken perpendicular to the length. An exemplary embodiment of the light blocking patterns 120a and 120b may include a first light blocking pattern 120a overlapping at least a portion of a thin film transistor T and a second light blocking pattern 120b lengthwise extending in a second direction D2. In an exemplary embodiment of a method of manufacturing a display device, the first and second light blocking patterns 120a and 120b may be simultaneously provided in a same process such as from a same material layer. The first and second light blocking patterns 120a and 120b are disposed in a same layer of the display substrate 100 among layers thereof disposed on the base substrate 110.

The first light blocking pattern 120a is disposed to overlap at least a portion of the thin film transistor T, thus blocking light incident from the backlight unit to the thin film transistor T. The first light blocking pattern 120a does not overlap the gate line GL.

The second light blocking pattern 120b is disposed lengthwise along the second direction D2 to overlap each of data lines $DL_{n+1}$ and $DL_{n+2}$ adjacent to each other and each of the pixel electrodes $PE_n$ and $PE_{n+1}$ adjacent to each other, and is thus capable of reducing or effectively preventing light leakage that may occur among the data lines $DL_{n+1}$ and $DL_{n+2}$ and the pixel electrodes $PE_n$ and $PE_{n+1}$.

The first insulating layer 130 is disposed on the base substrate 110 on which the light blocking patterns 120a and 120b are disposed. The first insulating layer 130 may include silicon oxide (SiOx) or silicon nitride (SiNx).

The semiconductor layer SM is disposed on the first insulating layer 130. The semiconductor layer SM is disposed to overlap the first light blocking pattern 120a.

The semiconductor layer SM may include or be formed of amorphous silicon or an oxide semiconductor including at least one selected from gallium (Ga), indium (In), tin (Sn) and zinc (Zn). Although not illustrated, an ohmic contact layer may be disposed on the semiconductor layer SM.

The data lines $DL_n$, $DL_{n+1}$ and $DL_{n+2}$ lengthwise extending in the second direction D2, a source electrode SE branching off from the data lines $DL_n$, $DL_{n+1}$ and $DL_{n+2}$ to overlap a first end portion of the semiconductor layer SM, and a drain electrode DE spaced apart from the source electrode SE and overlapping a second end portion of the semiconductor layer SM opposite to the first end thereof are disposed on the semiconductor layer SM. That is, the semiconductor layer SM is disposed under the source and drain electrodes SE and DE.

The second insulating layer 150 is disposed on the base substrate 110 on which the data lines $DL_n$, $DL_{n+1}$ and $DL_{n+2}$, the source electrode SE and the drain electrode DE are disposed. The second insulating layer 150 may include silicon oxide (SiOx) or silicon nitride (SiNx), and may also be referred to as a gate insulating layer.

Gate lines $GL_{n-1}$ and $GL_n$ extending in the first direction D1 and a gate electrode GE branching off from the gate lines $GL_{n-1}$ and $GL_n$ to overlap the semiconductor layer SM are disposed on the second insulating layer 150.

The third insulating layer 160 is disposed on the base substrate 110 on which the gate lines $GL_{n-1}$ and $GL_n$ and the gate electrode GE are disposed. The third insulating layer 160 may be a color filter.

The pixel electrodes $PE_n$ and $PE_{n+1}$ are disposed on the third insulating layer 160. The pixel electrodes $PE_n$ and $PE_{n+1}$ on the third insulating layer 160 extend to pass through the third insulating layer 160 to be connected to the drain electrode DE. Referring to FIG. 9, an opening is defined in or by the second and third insulating layers 150 and 160, and pixel electrodes $PE_n$ and $PE_{n+1}$ on the third insulating layer 160 extend into the opening to contact the drain electrode DE at the opening.

The pixel electrodes $PE_n$ and $PE_{n+1}$ define lengths thereof which are larger than widths thereof taken perpendicular to the lengths. Referring to FIG. 8, the pixel electrodes $PE_n$ and $PE_{n+1}$ have a shorter dimension (e.g., width) in the first direction D1 than in the second direction D2.

The black matrix BM is disposed on the base substrate 110 on which the pixel electrodes $PE_n$ and $PE_{n+1}$ are disposed. The black matrix BM defines a length thereof which is larger than a width thereof taken perpendicular to the length. The black matrix BM may lengthwise extend in the first direction D1 to overlap the thin film transistor T, the gate lines $GL_{n-1}$ and $GL_n$, and the first light blocking pattern 120a. The black matrix BM reduces or effectively prevents light provided from the backlight unit (not illustrated) from being dissipated externally, and reduce or effectively prevents external light from being irradiated to the thin film transistor T and the gate lines $GL_{n+1}$ and $GL_n$.

A lower alignment layer (not illustrated) may be disposed on the pixel electrodes $PE_n$ and $PE_{n+1}$ and the black matrix BM. The lower alignment layer may be a homeotropic alignment layer or a photoalignment layer including a photopolymerizable material.

The second light blocking pattern 120b is disposed to overlap at least a portion of the pixel electrode $PE_n$ and an adjacent data line $DL_{n+1}$ in the top plan view. The pixel electrode $PE_n$ and the data line $DL_{n+1}$ may be separated from each other in the first direction D1 in the top plan view. That is, the second light blocking pattern 120b is disposed between the pixel electrode $PE_n$ and the adjacent date line $DL_{n+1}$ in the top plan view. In addition, the data line $DL_{n+1}$ may be disposed to overlap another pixel electrode $PE_{n+1}$ adjacent to and separated from the pixel electrode $PE_n$ in the top plan view. That is, the second light blocking pattern 120b and the data line $DL_{n+1}$ collectively form a light blocking member between the pixel electrodes $PE_n$ and $PE_{n+1}$ which are adjacent to and separated from each other.

Accordingly, light leakage that may occur in an area between the pixel electrodes $PE_n$ and $PE_{n+1}$ adjacent to each other may be reduced or effectively prevented using the second light blocking pattern 120b and the date line $DL_{n+1}$. The area is defined between edges of the pixel electrodes $PE_n$ and $PE_{n+1}$ adjacent to each other. The second light blocking pattern 120b and the data line $DL_{n+1}$ disposed in the area at edges of the pixel electrodes $PE_n$ and $PE_{n+1}$ adjacent to each other may overlap an entirety of the area 'd'.

In an exemplary embodiment of an LCD device, a light blocking member or a shielding electrode that are conventionally disposed among conventional pixel electrodes adjacent to and separated from each other may be omitted such that an aperture ratio may be improved.

The opposing substrate 200 may include an opposing base substrate 210, a common electrode 220 and the like. An upper alignment layer (not illustrated) may be disposed on the common electrode 220. The upper alignment layer (not illustrated) may be a homeotropic alignment layer or a photoalignment layer including a photopolymerizable material.

Figure 10:
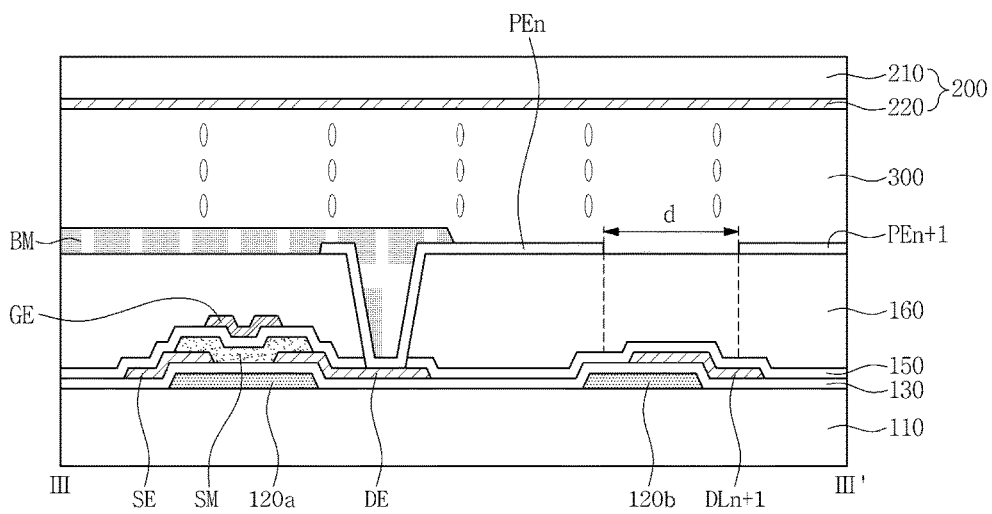
FIG. 10 is a cross-sectional view illustrating an alternative exemplary embodiment of an LCD device taken along line III-III' of FIG. 8.

FIG. 10 is a cross-sectional view illustrating an alternative exemplary embodiment of an LCD device. Repeated descriptions of an exemplary embodiment will be omitted in descriptions pertaining to an alternative exemplary embodiment.

Referring to FIG. 10, an alternative exemplary embodiment of a display device as an LCD device includes a display substrate 100, an opposing substrate 200, and an optical medium layer such as a liquid crystal layer 300 between the display substrate 100 and the opposing substrate 200. The display substrate 100, the opposing substrate 200 and the optical medium layer 300 may collectively form a display panel of the LCD device which generates and displays an image.

The display substrate 100 includes a base substrate 110, light blocking patterns 120a and 120b, a first insulating layer 130, a data wiring $DL_{n+1}$, SE, and DE, a semiconductor layer SM, a second insulating layer 150, a gate wiring including gate lines $GL_{n-1}$, $GL_n$, and a gate electrode GE, a third insulating layer 160, pixel electrodes $PE_n$ and $PE_{n+1}$, a black matrix BM and the like.

The light blocking patterns 120a and 120b are disposed on the base substrate 110. The light blocking patterns 120a and 120b include a first light blocking pattern 120a overlapping at least a portion of a thin film transistor T and a second light blocking pattern 120b lengthwise extending in a second direction D2.

The first insulating layer 130 is disposed on the base substrate 110 on which the light blocking patterns 120a and 120b are disposed.

The data wiring $DL_{n+1}$, SE and DE including a data line $DL_{n+1}$, a source electrode SE and a drain electrode DE is disposed on the first insulating layer 130.

The semiconductor layer SM is disposed on the base substrate 110 on which the data wiring $DL_{n+1}$, SE and DE is disposed. The semiconductor layer SM is disposed to overlap the first light blocking pattern 120a. A first end portion of the semiconductor layer SM is connected to the source electrode SE, and a second end portion of the semiconductor layer SM opposite to the first end is connected to the drain electrode DE. That is, the semiconductor layer SM is disposed above the source and drain electrodes SE and DE.

The second insulating layer 150 is disposed on the base substrate 110 on which the semiconductor layer SM is disposed.

A gate electrode GE is disposed on the second insulating layer 150. The gate electrode GE is disposed to overlap the semiconductor layer SM. The third insulating layer 160 is disposed on the base substrate 110 on which the gate electrode GE is disposed. The third insulating layer 160 may be a color filter.

The pixel electrodes $PE_n$ and $PE_{n+1}$ are disposed on the third insulating layer 160.

The black matrix BM is disposed on the base substrate 110 on which the pixel electrodes $PE_n$ and $PE_{n+1}$ are disposed. The black matrix BM may be disposed to overlap the first light blocking pattern 120a.

The second light blocking pattern 120b overlaps at least a portion of the pixel electrode $PE_n$ and an adjacent data line $DL_{n+1}$ in the top plan view. The pixel electrode $PE_n$ and the data line $DL_{n+1}$ may be separated from each other in the first direction D1 in the top plan view. That is, the second light blocking pattern 120b is disposed between the pixel electrode $PE_n$ and the adjacent date line $DL_{n+1}$ in the top plan view. In addition, the data line $DL_{n+1}$ may be disposed to overlap another pixel electrode $PE_{n+1}$ adjacent to and separated from the pixel electrode $PE_n$ in the top plan view. That is, the second light blocking pattern 120b and the data line $DL_{n+1}$ collectively form a light blocking member between the pixel electrodes $PE_n$ and $PE_{n+1}$ which are adjacent to and separated from each other.

Accordingly, light leakage that may occur in an area between the pixel electrodes $PE_n$ and $PE_{n+1}$ spaced apart from each other may be reduced or effectively prevented using the second light blocking pattern 120b and the date line $DL_{n+1}$. The second light blocking pattern 120b and the data line $DL_{n+1}$ disposed in the area 'd' may overlap an entirety of the area 'd'.

As set forth hereinabove, in one or more exemplary embodiments of a display device such as an LCD device, light leakage that occurs between a pixel electrode and a signal line may be effectively reduced using a light blocking pattern already configured to block light incident to a thin film transistor area.

In one or more exemplary embodiments of an LCD device, a light blocking member or a shielding electrode that are conventionally disposed among conventional pixel electrodes adjacent to and separated from each other is not provided among pixel electrodes such that an aperture ratio may be improved.

In one or more exemplary embodiments of an LCD device, the separate light blocking member or the shielding electrode that are conventionally disposed among conventional pixel electrodes adjacent to and separated from each other is not provided among the pixel electrodes and thus a manufacturing process may become relatively easy.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
a base substrate including a plurality of pixel areas at which an image is displayed;
a light blocking pattern on the base substrate;
a thin film transistor on the light blocking pattern;
a pixel electrode in each of the pixel areas, a dimension of the pixel electrode in a first direction being larger than a dimension of the pixel electrode in a second direction crossing the first direction; and
a gate line and a data line each connected to the thin film transistor,
wherein
one line among the gate line and the data line has a length extending along the larger dimension of the pixel electrode,
the other line among the gate line and the data line has a length extending along the smaller dimension of the pixel electrode,
in the second direction:
a first pixel electrode is adjacent to and spaced apart from a second pixel electrode, and
the one line having the length extending along the larger dimension of the pixel electrode is spaced apart from the first pixel electrode and overlaps the second pixel electrode, and
the light blocking pattern comprises:
a first light blocking pattern defining a length thereof extending along the larger dimension of the pixel electrode,
along the second direction, the first light blocking pattern spaced apart from the second pixel electrode and overlapping the pixel electrode and the one line having the length extending along the larger dimension of the pixel electrode; and
a second light blocking pattern of which a portion thereof overlaps the thin film transistor, the second light blocking pattern having first and second edges extending along the second direction between the pixel electrode and the other line having the length extending along the smaller dimension of the pixel electrode,
wherein
the first edge of the second light blocking pattern is adjacent to and spaced apart from the other line having the length extending along the smaller dimension of the pixel electrode,
the second edge of the second light blocking pattern is adjacent to and spaced apart from the pixel electrode, and
the thin film transistor is disposed between the first and second edges of the second light blocking pattern.

2. The display device as claimed in claim 1, wherein the first light blocking pattern is disposed between the one line having the length extending along the larger dimension of the pixel electrode and the first pixel electrode spaced apart therefrom, in a top plan view.

3. The display device as claimed in claim 1, wherein the first light blocking pattern which defines the length thereof along the larger dimension of the pixel electrode, is spaced apart from the second pixel electrode overlapped by the one line having the length extending along the larger dimension of the pixel electrode.

4. The display device as claimed in claim 1, further comprising a black matrix disposed on the thin film transistor and the other line among the gate line and the data line having a length extending along the smaller dimension of the pixel electrode, the black matrix defining a length thereof extending in the second direction.

5. The display device as claimed in claim 1, wherein the one line having the length extending along the larger dimension of the pixel electrode together with the first light blocking pattern defining the length thereof extending along the larger dimension of the pixel electrode overlaps an entirety of a distance in the second direction between the first and second pixel electrodes spaced apart from each other.

6. The display device as claimed in claim 1, wherein
the one line having the length extending along the larger dimension of the pixel electrode is the gate line,
the other line having the length extending along the smaller dimension of the pixel electrode is the data line, and
the thin film transistor comprises:
a semiconductor layer on the base substrate;
a gate electrode branching off from the gate line and disposed on the semiconductor layer;
a source electrode branching off from the data line and connected to the semiconductor layer; and
a drain electrode spaced apart from the source electrode and connected to the semiconductor layer.

7. The display device as claimed in claim 6, wherein the semiconductor layer is disposed respectively between the light blocking pattern, and the source electrode and the drain electrode.

8. The display device as claimed in claim 6, wherein the source electrode and the drain electrode are each disposed between the light blocking pattern and the semiconductor layer.

9. The display device as claimed in claim 6, wherein the semiconductor layer comprises at least one selected from zinc oxide, zinc tin oxide, zinc indium oxide, indium oxide, titanium oxide, indium-gallium-zinc oxide and indium-zinc-tin oxide.

10. The display device as claimed in claim 1, wherein the first light blocking pattern and the second light blocking pattern are connected to each other at an intersecting area therebetween.

11. The display device as claimed in claim 1, wherein the first light blocking pattern and the second light blocking pattern are separated from each other at a virtual intersecting area therebetween.

12. The display device as claimed in claim 1, wherein the pixel electrode comprises a cross-shaped stem portion and a branch portion which extends from the cross-shaped stem portion.

13. The display device as claimed in claim 12, wherein the light blocking pattern further comprises a third light blocking pattern disposed on the base substrate and overlapping the cross-shaped stem portion of the pixel electrode.

14. The display device as claimed in claim 13, wherein the first, second and third light blocking patterns are disposed in a same layer as each other.

15. The display device as claimed in claim 1, wherein
the one line having the length extending along the larger dimension of the pixel electrode is the data line,
the other line having the length extending along the smaller dimension of the pixel electrode is the gate line, and
the thin film transistor comprises:
a semiconductor layer on the base substrate;
a gate electrode branching off from the gate line and disposed on the semiconductor layer;

a source electrode branching off from the data line and connected to the semiconductor layer; and
a drain electrode spaced apart from the source electrode and connected to the semiconductor layer.

* * * * *